United States Patent

Mara, Jr. et al.

[11] Patent Number: 5,162,755
[45] Date of Patent: Nov. 10, 1992

[54] RADIO FREQUENCY AMPLIFIER CIRCUIT

[75] Inventors: John F. Mara, Jr., Nashua; Mark E. Russell, Londonderry, both of N.H.; Russell W. Hansen, Stoughton, Mass.

[73] Assignee: Raytheon Company, Lexington, Mass.

[21] Appl. No.: 784,358

[22] Filed: Oct. 29, 1991

[51] Int. Cl.$^5$ .......................... H03F 1/34; H03F 3/193
[52] U.S. Cl. .................................. 330/277; 330/286; 330/294
[58] Field of Search .................. 330/277, 286, 294

[56] References Cited

PUBLICATIONS

Tajima et al., "X, Ku-Band GaAs Monolithic Amplifier", 1982, *IEEE MTT-S Digest*, pp. 476-478.

*Primary Examiner*—James B. Mullins
*Attorney, Agent, or Firm*—Donald F. Mofford; Richard M. Sharkansky

[57] ABSTRACT

A radio frequency (RF) amplifier circuit includes an input matching network having a first port coupled to an input port of the circuit. The RF amplifier circuit further includes a high electron mobility field effect transistor (HEMT) having source, gate and drain electrodes with the gate electrode coupled to the second port of the input impedance matching network and means, coupled between the source electrode and a DC reference potential, for providing inductive feedback to the source electrode of the HEMT. The RF amplifier circuit further includes an output matching network having a first port coupled to the drain electrode of the HEMT. The output matching network comprises a first RF propagation network having a first end coupled to the first port of the output matching network and a second end coupled to a first electrode of a capacitor. A second electrode of the capacitor is coupled to a second port of the output matching network. The RF amplifier circuit further includes a monolithic microwave integrated circuit amplifier having an input port coupled to the second port of the output matching network and having an output port coupled to an output port of the RF amplifier circuit.

4 Claims, 2 Drawing Sheets

RADIO FREQUENCY AMPLIFIER CIRCUIT

This invention was made with under Contract No. DAAH01-87-C-A025 awarded by the Department of the Army. The Government has certain rights in this invention.

BACKGROUND OF THE INVENTION

This invention relates generally to radio frequency amplifier circuits and more particularly to low noise radio frequency amplifier circuits.

As is known in the art a radar system is one particular type of radio frequency (RF) system which detects RF signals. The radar system generally includes an antenna, a transmitter and a receiver. In a transmit mode, the radar transmitter emits an RF signal from the antenna. Portions of the transmitted RF signal which are intercepted by an object (e.g. a target) and reflected back toward the radar are generally referred to as an "echo" or "received" signals.

The antenna intercepts a portion of the echo signal having an RF frequency and feeds such signals to the receiver. The receiver detects RF signals fed thereto and provides an intermediate frequency (IF) signal at an output port. The IF signal is subsequently fed to a digital signal processor for further signal processing as is generally known.

Noise is unwanted RF energy which interferes with the ability of the receiver to detect the echo signal. The capability of the receiver to detect a weak echo signal is limited by the noise energy that occupies the same portion of the frequency spectrum as does the echo signal.

Noise energy may enter the radar receiver from external sources along with the echo signal via the antenna. Noise energy may also originate in the receiver itself due to various causes such as thermal motion of conduction electrons in ohmic portions of those circuit components which are disposed to provide the receiver. The receiver cannot detect the presence any signal having a power level below the power level of the noise energy. The weakest signal the receiver may detect is generally referred to as the minimum detectable signal. Thus, the power level of the noise energy is said to "set" the power level of the minimum detectable signal.

In the absence of a so-called jamming signal, external sources provide relatively low power levels of noise energy. Thus the noise energy provided by the radar receiver limits the power level of the minimum detectable signal.

The effectiveness of the receiver to detect echo signals in the presence of noise energy may be represented by a figure of merit generally referred to as the noise figure of the receiver. In general, the noise figure of a radar receiver may be defined as the input signal to noise ratio divided by the output signal to noise ratio. The input signal to noise ratio is provided by the ratio of the input signal power to the input noise power. The output signal to noise ratio is provided by the ratio of the receiver output signal power to the output noise power. Thus, the noise figure may be interpreted as a degradation of the input signal to noise ratio as the echo signal passes through the receiver.

In the ideal case, the receiver should not degrade the input signal to noise ratio. Therefore, in the ideal case, the noise figure of the receiver is unity (i.e. 0 decibels).

Every circuit component disposed to provide the receiver contributes to the noise figure of the receiver. The composite noise figure of N circuit components connected in cascade may be calculated from Equation 1.

$$F_{cas} = F_1 + \frac{F_2 - 1}{G_1} + \frac{F_3 - 1}{G_1 G_2} + \cdots + \frac{F_N - 1}{(G_1)(G_2)\ldots(G_{N-1})} \quad \text{(Eq. 1)}$$

In Equation 1, $F_{cas}$ is the noise figure of the cascade connection, F1 and G1 are the noise figure and power gain respectively of the first component in the cascade connection, F2 and G2 are the noise figure and power gain of the second component, etc. . . . Note that the term $G_1$ (i.e. the gain of the first component) appears in the denominator of all of the terms following the term $F_1$. Thus, the contribution to the cascaded noise figure $F_{cas}$ of those circuit components following the first component is reduced by the power gain $G_1$ of the first component.

A radar system having a so-called low noise receiver generally includes a low noise amplifier (LNA) and a mixer connected in cascade. The LNA is provided having a high power gain characteristic $G_1$ and a noise figure $F_1$ close to unity. The mixer is provided having a power gain characteristic $G_2$ which, in general, is less than unity and a noise figure $F_2$. Thus, to provide a receiver having a relatively low noise figure the LNA is provided as the first active component of the receiver.

Because of the low noise figure and high gain characteristic of the LNA those circuit components which follow the LNA have little effect on the noise figure of the receiver. Thus the LNA is said to "set" the overall noise figure of the receiver.

Conventional low noise amplifiers include two or three discrete transistors such as field effect transistors for example, connected in cascade. One particular type of field effect transistor having low noise characteristics is the so-called high electron mobility field effect transistor (HEMT). Thus a low noise amplifier is provided by cascade connecting such HEMTs.

In general HEMTs have respectively input and output impedances which differ significantly from the characteristic impedance of transmission lines coupled to the LNA. Therefore, HEMTs generally require input and output impedance matching networks for each amplifier stage. Thus, in the LNA several of such amplifier stages (i.e. HEMT and input matching network and output matching network) are cascade connected together.

Several problems exist with this approach. First, the input and output impedance matching networks may be relatively complex and further such networks have a relatively high insertion loss characteristic. High insertion loss will reduce power gain and increase the noise figure of the LNA. To compensate for losses in the matching network, one could bias the HEMT to provide high gain and thus provide an overall gain for the amplifier.

However HEMT transistors when biased to provide a relatively high power gain characteristic provide a potentially unstable amplifier stage. That is, a particular impedance characteristic provided to the input or output port of the HEMT amplifier stage having a high power gain characteristic could cause the HEMT amplifier stage to become unstable and oscillate. Thus, to provide a practical LNA comprised of HEMT amplifier stages a design trade-off is made between the power gain characteristic and the stability requirement of the amplifier stage. This trade off thus results in an overall lower power gain or higher noise characteristic for the amplifier circuit.

Furthermore, in some radar system applications such as missile guidance radar systems where a limited amount of space is available, such low noise amplifier circuits must be provided in a relatively small package size. Moreover, in expendable systems such as missile guidance radar systems a relatively low cost amplifier circuit is desirable since the missile explodes at the end of its flight. Also, such circuits should be easily manufactured using current state of the art manufacturing techniques to provide reliable circuits having electrical characteristics which do not vary substantially among several of such circuits.

Although monolithic microwave integrated circuits (MMICs) satisfy the small package size required of circuits used in a missile guidance radar system several problems exist with a complete MMIC circuit approach. First MMIC circuits are relatively expensive. Moreover, in those applications requiring both low noise figure and high gain, use of a solely MMIC circuit approach may not provide an amplifier having the requisite gain and noise figure requirements. Thus, given the size, cost and manufacturing requirements of a missile guidance radar system it is relatively difficult to provide a RF amplifier circuit having a low noise figure and a high gain characteristic.

SUMMARY OF THE INVENTION

In accordance with the present invention a radio frequency (RF) amplifier circuit includes an input impedance matching network having a first port coupled to an input port of the circuit and having a second port. The input impedance matching network comprises a first RF propagation network having a first impedance characteristic and having a first end coupled to the first port of the input impedance matching network and a second RF propagation network having a second impedance characteristic and having a first end and a second end with the first end of the second RF propagation network coupled to a second end of said first RF propagation network. The input impedance matching network further includes a third RF propagation network having a third impedance characteristic and having a first end and a second end with the first end of the third RF propagation network coupled to the second end of the second RF propagation network and the second end of the third RF propagation network coupled to the second port of the input impedance matching network. The input impedance matching network further includes a fourth RF propagation network having a first end coupled to the second end of the first RF propagation network and a second end left open circuited and a fifth RF propagation network having a first end coupled to the second end of the second RF propagation network and a second end connected to ground. The RF amplifier circuit further includes a high electron mobility field effect transistor (HEMT) having source, gate and drain electrodes with the gate electrode coupled to the second port of the input impedance matching network and means, coupled between the source electrode and a DC reference potential, for providing inductive feedback to the source electrode of the HEMT. The RF amplifier circuit further includes an output impedance matching network having a first port coupled to the drain electrode of the HEMT and having a second port. The output impedance matching network comprises a first RF propagation network having a first end and a second end with the first end coupled to the first port of the output impedance matching network and a capacitor having a first electrode coupled to the second end of the first RF propagation network and a second electrode coupled to the second port of the output impedance matching network. The RF amplifier circuit further includes a monolithic microwave integrated circuit (MMIC) amplifier having an input port coupled to the second port of the output impedance matching network and having an output port coupled to an output port of the RF amplifier circuit. With this particular arrangement an RF amplifier circuit having a low noise characteristic and a high gain characteristic is provided. By providing the HEMT as the first stage of the RF amplifier circuit the RF amplifier circuit is provided having a low noise figure. By providing the MMIC amplifier having a high power gain characteristic as the second stage of the RF amplifier circuit the RF amplifier circuit is provided having an overall gain characteristic. Moreover by providing the MMIC amplifier circuit having a high gain characteristic the HEMT amplifier stage may be provided having a lower gain characteristic than HEMT amplifier stages in conventional low noise amplifier circuits. Thus, the HEMT amplifier stage is a stable amplifier stage. Furthermore, the second stage MMIC amplifier circuit buffers the HEMT from undesirable impedance characteristic variations at the output port of the RF amplifier circuit. Thus, such impedance variations will tend to have a lower propensity to cause the HEMT amplifier stage to oscillate, and the RF amplifier circuit as a whole is more stable while still having high gain and low noise characteristics.

To further increase stability, an attenuator may be disposed between the output impedance matching network of the HEMT and the second stage MMIC amplifier circuit. Preferably, the attenuator provides a low insertion loss characteristic to those signals having a frequency in the frequency band of operation while providing high insertion loss characteristic to those signals having a frequency outside the frequency band of operation. Thus, the attenuator further enhances the stability of the RF amplifier circuit while having a minimal effect on the noise figure of the RF amplifier circuit.

Brief Description of the Drawings

The foregoing features of the invention as well as the invention itself may be fully understood from the following detailed description of the drawings in which.

DESCRIPTION OF THE PREFERRED EMBODIMENT

Figure 1:
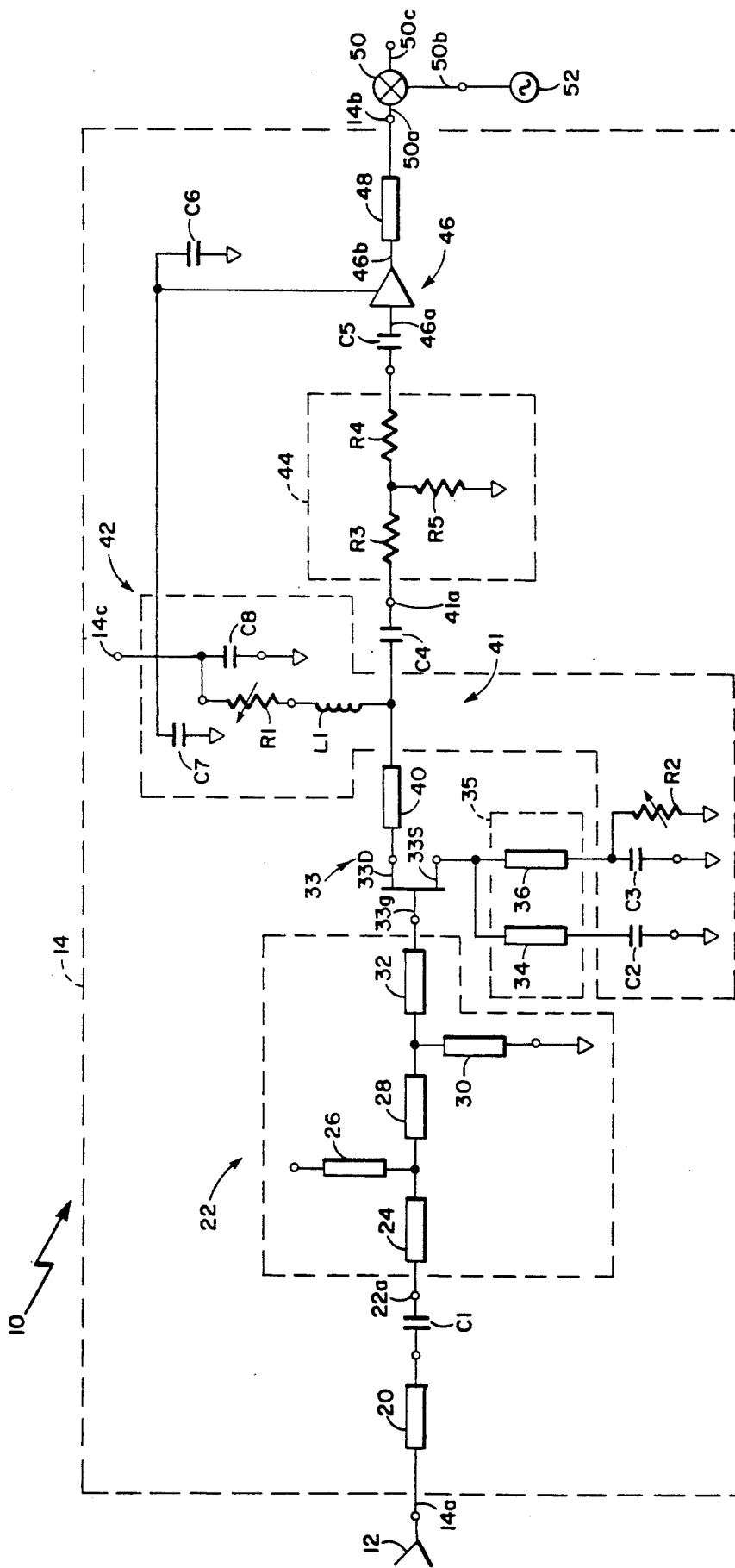
FIG. 1 is a schematic diagram of an RF receiving system including a low noise amplifier.

Referring now to FIG. 1, a radio frequency (RF) receiving system 10 includes an antenna 12 coupled to an input port 14a of a low noise amplifier (LNA) 14. The output terminal 14b of the LNA 14 is coupled to a first port 50a of a mixer 50. The LNA 14 feeds an RF signal to the port 50a of the RF mixer 50. A local oscillator signal source 52 provides a local oscillator signal to a second port 50b of the mixer 50. In response to the RF signal fed to the port 50a and the local oscillator signal fed to the port 50b, the mixer 50 provides an intermediate frequency (IF) output signal at a third port 50c. The IF output signal is here provided at the port 50c having as frequency corresponding to the difference in frequency between the LO signal and the RF signal as is generally known.

The low noise amplifier 14 is shown having the input port 14a coupled to a first end of an input RF propagation network 20. The second end of the RF propagation network 20 is coupled via a DC blocking capacitor C1 having a capacitance typically of about 39 pico-farads (pf) to an input port 22a of an input impedance matching circuit 22.

The input impedance matching network 22 having the input port 22a and an output port 22b includes a first RF propagation network 24 having an impedance characteristic typically of about 34 ohms and an electrical pathlength typically of about 0.02 wavelengths at the desired frequency of operation. The RF propagation network 24 has a first end coupled to the input port 22a. A second end of the first RF propagation network 24 is coupled to a first end of a second RF propagation network 28 having an impedance characteristic typically of about 37 ohms and an electrical pathlength typically of about 0.04 wavelengths at the desired frequency of operation.

A first transmission line resonator 26, here provided as a so-called open circuit stub having an electrical pathlength typically of about 0.12 wavelengths at the desired frequency of operation and an impedance characteristic typically of about 75 ohms, is coupled to the junction of the RF propagation networks 24 and 28. A second transmission line resonator 30, here provided as a so-called short circuit stub having an electrical pathlength of about 0.4 wavelengths at the desired frequency of operation and an impedance characteristic typically of about 85 ohms, is coupled to a second end of the RF propagation network 28. A third RF propagation network 32 having an impedance characteristic typically of about 75 ohms and an electrical pathlength typically of about 0.1 wavelengths at the desired frequency of operation has a first end coupled to the second end of the propagation network 28. A second end of the RF propagation network 32 is coupled to the output port 22b of the matching network 22. The output port 22b of the impedance matching network 22 is coupled a gate electrode 33g of a high electron mobility transistor (HEMT) 33.

The impedance characteristics and electrical path lengths of the propagation networks 24, 28, 32 as well as the electrical pathlengths of the transmission line resonators 26 and 30 are selected to provide the network 22 having an impedance characteristic at the input and output ports 22a, 22b. The impedance characteristic at the input port 22a provides a matched impedance characteristic at the input port 14a.

The impedance characteristic at the output port 22b is selected to provide the HEMT 33 having a relatively low noise figure. That is the impedance provided by the input matching network 22 is selected in relation to the impedance characteristics of the HEMT to provide a low noise figure at the desired frequency of operation. Thus, the particular impedance values and line lengths of the transmission lines 29, 28, 32 and of the transmission line resonators 26, 30 of the input matching network 22 are here selected in relation to the input impedance of the HEMT at a particular frequency to provide the HEMT having a low noise characteristic.

The HEMT 33 further includes a source electrode 33s coupled to a series inductive feedback network 35. By providing an impedance characteristic to the source electrode 33s, the impedance characteristic at the gate electrode 33g may be affected. Thus the feedback network 35 affects the impedance characteristic at the gate electrode 33g.

The network 35 includes a first high impedance RF propagation network 34 having an impedance characteristic typically of about 65 ohms and having a first end coupled to the source electrode 33s and a second end coupled to a first electrode of a capacitor C2 having a capacitance typically of about 39 pf. A second end of the capacitor C2 is coupled to a reference potential, here said reference potential being ground. The network 35 further includes a second high impedance RF propagation network 36 having an impedance characteristic typically of about 65 ohms and having a first end coupled to the source electrode 33s and a second end coupled to a first electrode of a capacitor C3 having a capacitance typically of about 39 pf. A second end of the capacitor C3 is coupled to a reference potential, here said reference potential being ground.

It should be noted that two high impedance RF propagation networks were here used for reasons which will be discussed in conjunction with FIG. 2. Suffice it here to say the two RF propagation networks 34, 36 may be replaced by a single RF propagation network having an appropriate impedance characteristic.

Drain and source bias voltages are provided to the HEMT 33 via a DC bias network 42. The bias network 42 having the DC bias terminal 14c includes a pair of decoupling capacitors C7 and C8 each having a capacitance typically of about 39 pf coupled in shunt between the DC bias terminal 14c and ground. The capacitors C7, C8 should each provide a relatively small reactance at the desired frequency of operation. The DC bias network 42 further includes a resistor R1 having a resistance typically of about 110 ohms ($\Omega$). The resistor R1 is serially coupled between the DC bias terminal 14C and a first electrode of an inductor L1 having an inductance typically of about 13 nanohenries (nh). A second electrode of the inductor L1 is coupled to the second end of the RF propagation network 40. The inductor L1 provides a DC signal path having a low impedance characteristic between the resistor R1 and the second end of the RF propagation network 40 while also providing a high impedance characteristic to RF signals fed thereto and thus preventing RF energy from propagating along the DC bias lines as is generally known. The drain bias voltage is thus provided to the drain electrode 33d through the resistor R1, the inductor L1 and the RF propagation network 40.

The source bias voltage is provided to the source electrode 33s via the source bypass capacitors C2 and C3 and a source resistor R2 having a resistance in the range of 10 $\Omega$ to 20 $\Omega$. The capacitors C2, C3 provide a DC block and further provide the inductive feedback network 35 having an RF path to ground.

A DC blocking capacitor C4 having a capacitance typically of about 1.2 pf couples the RF propagation network 40 to an optional attenuator 44. The capacitor C4 and the RF propagation network 40 here provide an output matching network 41. The output matching network 41 provides the HEMT 33 having the maximum gain for the lowest noise figure. Further the output matching network 41 here provides an output impedance characteristic typically of about 50 Ω at a junction 41a.

The attenuator 44 here includes resistors R3, R4 and R5 disposed to provide a so-called T network. The resistance values of the resistors R3, R4 and R5 may be selected to provide the attenuator having an insertion loss characteristic in the range of 1.0 to 2.0 decibels (dB) in the frequency band of operation. Outside the frequency band of operation, however, and particularly at those frequencies above the frequency band of operation, the attenuator 44 provides a relatively high insertion loss characteristic.

For example, the attenuator 44 may provide an insertion loss characteristic of 3 dB or more to those signals having a frequency above the frequency band of operation. A 3 dB insertion loss characteristic corresponds to a 6 dB improvement in the return loss characteristic presented to the output port 41a of the output matching network 41. A 6 dB improvement in the insertion loss characteristic presented to the output port 41a of the output matching network ensures the HEMT 33 will be unconditionally stable (i.e. will not provide on oscillation signal) regardless of the impedance characteristic provided to the output port 41a.

Such an insertion loss characteristic is desirable in the attenuator 44 since a particular HEMT 33 may be responsive to signals outside the frequency band of interest. That is, RF signals outside the frequency band of interest may provide an impedance characteristic to the HEMT 33, at the drain electrode 33d for example, in response to which the HEMT 33 may provide an oscillation signal. Such an oscillation signal interferes with the operation of the amplifier and degrades the noise figure of the LNA. Thus, such an oscillation signal is generally seen as being undesirable. Therefore the attenuator 44 having such an insertion loss characteristic prevents the LNA 14 from providing such oscillation signals while still providing the LNA 14 having a low noise figure.

A second end of the attenuator 44 is coupled to a first electrode of a DC blocking capacitor C5 having a capacitance typically of about 39 pf. If the attenuator 44 is omitted, the capacitors C4, C5 may be connected via an RF propagation network (not shown). Alternatively, if the attenuator is omitted, the capacitors C4 and C5 may be replaced by a single capacitor (not shown) having an equivalent capacitance. A second electrode of the capacitor C5 is coupled to a second amplifier circuit here provided preferably as a monolithic microwave integrated circuit (MMIC) amplifier 46 at an input port 46a having an impedance characteristic typically of about 50 ohms.

An output port 46b of the MMIC amplifier 46 is coupled to the first end of an output RF propagation network 48 having an impedance characteristic typically of about 50 Ω. A second end of the output RF propagation network 48 is coupled to the output terminal 14b of the LNA 14. A bias voltage is provided to the second amplifier 46 via the DC bias network 42. A so-called bypass capacitor C6 having a capacitance typically of about 39 pf is coupled between the bias terminal 14c and ground to decouple RF signals from the bias network as is generally known.

Figure 2:
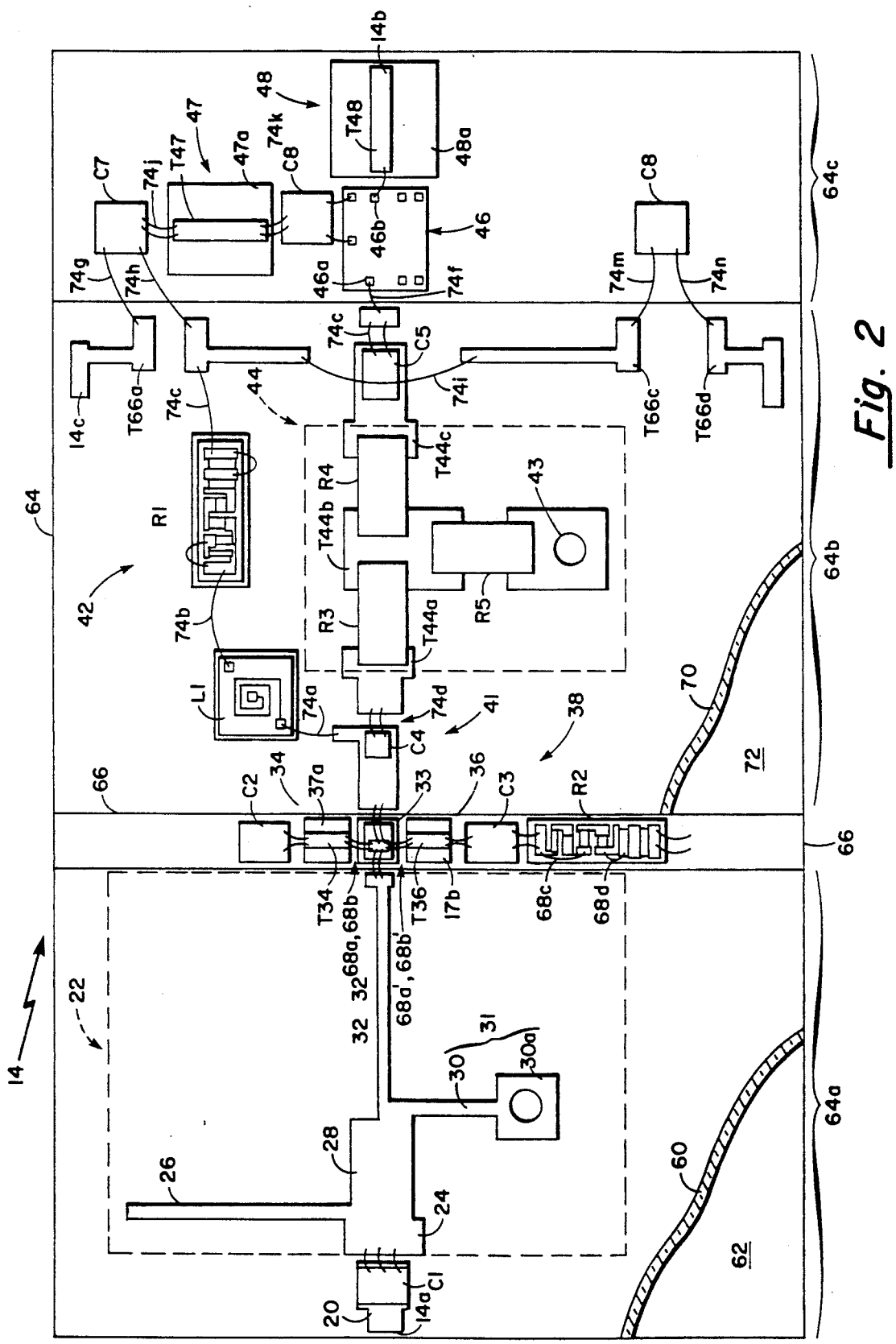
FIG. 2 is a preferred embodiment of the low noise amplifier shown in FIG. 2.

Referring now to FIG. 2 where like elements of the amplifier 14 of FIG. 1 are referenced with the same designations, a first substrate 60 having first and second opposing surfaces with a ground plane conductor 62 disposed over a first surface thereof is bonded to a conductive base 64 in a first region 64a using any technique well known to those of skill in the art. A plurality of strip conductors are disposed over a second surface of the substrate 60 to provide in combination with the substrate 60 and the ground plane 62 a plurality of microstrip transmission lines. Such lines are arranged to provide the input propagation network 20 and the input matching network 22 of FIG. 1. An aperture 30a is provided in substrate 60 and such aperture has a conductive deposit, such as gold for example, disposed therein to provide an electrically conductive path between the transmission line resonator 30 and the ground plane conductor 62. This arrangement provides a short circuit stub 31.

The conductive base 64 includes an electrically conductive member 66 on which the HEMT 33 and the source inductive feedback network 35 are disposed. The HEMT 33 may be provided for example as the type manufactured by NEC and identified as part number NE203. The HEMT 33 is here provided having a pair of source contact points (not numbered). The source inductive feedback network 35 is here provided from a pair of microstrip transmission lines 34, 36 each having a high impedance characteristic. The microstrip transmission line 34 is coupled to a first one of the source contact points and the microstrip transmission line 36 is coupled to a second one of the source contact points. Thus the inductive feedback network is symmetrically coupled to the source electrode 33s (FIG. 1) of the HEMT 33.

The transmission line 34 here includes a strip conductor T34 disposed over an alumina substrate 37a having a thickness typically of about 0.010 inches and a relative dielectric constant typically of about 9.9. Similarly, the transmission line 36 includes a strip conductor T36 disposed over an alumina substrate 37b having the same thickness and relative dielectric constant as the substrate 37a. A pair of bond wires 68a and 68b having a diameter of typically of about 0.0007 inches are used to couple to the microstrip transmission line 34 to the source electrode 33s. The bond wires 68a, 68b should be electrically short to minimize added inductance between the source electrode 33s and the microstrip transmission 34. Likewise, a pair of bond wires 68a', 68b' couple the microstrip transmission line 36 to the source electrode 33s. Here the microstrip transmission lines 34, 36 are symmetrically coupled to the source electrode 33s.

The resistor R2 is here provided as a so-called tapped resistor chip. Bond wires 68c, 68d are selectively coupled along the tapped resistor R2 to provide the resistor R2 having an impedance in the range of 10 Ω to 240 Ω. Thus the resistor R2 may provide one of a plurality of discrete resistance values between 10 Ω and 240 Ω.

A second substrate 70 having first and second opposing surfaces with a ground plane conductor 72 disposed over a first surface thereof is bonded to a second region 64b of the conductive base 64 using any technique well known to those of skill in the art. The output matching network 41 here includes a strip conductor T40 disposed over the substrate 70 to provide the transmission line 40 as a microstrip transmission line. The capacitor C4, here a parallel plate capacitor chip, is disposed on the strip conductor T40 using a conductive epoxy.

The attenuator 44 here includes chip resistors R3, R4 and R5 disposed over the substrate 70 in contact with strip conductors T44a, T44b, T44c. A conductively filled via hole 43 provides an electrically conductive path between the resistor R5 and the ground plane conductor 72. The capacitor C5 is here provided as parallel plate capacitor chip disposed over the strip conductor T44c and epoxied to the strip conductor T44c using a conductive epoxy as is generally known.

The inductor L1 here provided as a so-called inductor chip and the resistor R1 here provided as a so-called tapped resistor chip having a resistance in the range of 10 Ω to 240 Ω are disposed over the second surface of the substrate 70. A plurality of bond wires 74a–74n generally denoted as 74 provide connections between a plurality of strip conductors T66a–T66d generally denoted as T66 disposed over the substrate 70. The bond wires 74 and strip conductors, T66 provide signal paths which connect the circuit components L1, R1 and C6, C7 and C8 and thus provide the DC bias network 42.

The monolithic integrated circuit amplifier 46, which may be of the type for example manufactured by Celeritek Corporation and identified as part number CMM-5, is disposed over a first surface of the conductive base 64 in a third region 64c. Similarly, chip capacitors C6, C7 and C8, are all disposed on the first surface of the third region 64c of the conductive base 64.

An alumina substrate 48a having a thickness typically of about 0.015 inches and a relative dielectric constant typically of about 9.9 is disposed over a portion of the first surface of the third region 64c. A strip conductor T48 is disposed over the alumina substrate 48a to provide the output propagation network 48 as a microstrip transmission line.

Similarly, a microstrip transmission line 47 provided from a substrate 47a and a strip conductor T47 provides a signal path which in conjunction with bond wires 74j and 74k electrically connects the decoupling capacitors C6 and C7.

To operate the amplifier 14, the resistors R1, R2 are provided having nominal resistance values typically of about 110 ohms (Ω) and 20 Ω respectively. A DC bias voltage typically of about +5 volts is provided to the HEMT 33 via the DC bias terminal 14c and the bias network 42. Depending on the particular HEMT 33, the resistance of the resistor R2 may be adjusted to provide the HEMT 33 having a drain current in the range of 15 milli-amperes (ma) to 20 ma. At such a drain current the HEMT 33 should have a drain to source voltage potential difference ($V_{DS}$) typically of about 3 V.

Because of the variations in electrical characteristics of practical circuit components, the nominal resistance values of the resistors R1 and R2 may provide a $V_{DS}$ which differs from the desired value of 3 V. Thus, in this instance, the resistance value of R1 may be adjusted to provide a $V_{DS}$ typically of about 3 V. Such an adjustment to the resistance value of R1 should have a minimum effect on the drain current.

It is desirable to provide the HEMT 33 having a $V_{DS}$ typically of about 3 V since the so-called S-parameters of the HEMT 33 at such a bias voltage should cooperate with the impedance characteristic of the input matching network 22 and the output matching network 41 to provide the LNA 14 having a minimum noise figure.

Similarly, the +5 V DC bias voltage is coupled from the DC bias terminal 14c to the monolithic integrated circuit amplifier 46 which may be provided for example as the type manufactured by Celeritek Corp. as part number CMM-5 via the microstrip transmission line 47. The amplifier 46 is provided having a DC current typically of about 90 ma. Thus, the LNA 14 is provided having a total DC current in the range of 105 ma to 110 ma.

Having described the preferred embodiments of the invention it will now become apparent to one of skill in the art that other embodiments incorporating their concepts can be used. It is felt, therefore, that these embodiments should not be limited to disclosed embodiments but rather should be limited only by the spirit and scope of the appended claims.

What is claimed is:

1. An RF amplifier circuit comprising:

an input impedance matching network having a first port coupled to an input port of the circuit and a second port, said input impedance matching network comprising:

a first RF propagation network having a first impedance characteristic and having a first end coupled to the first port of said input matching network;

a second RF propagation network having a second impedance characteristic and having a first end and a second end with the first end of said second RF propagation network coupled to a second end of said first RF propagation network;

a third RF propagation network having a third impedance characteristic and having a first end and a second end with the first end of said third RF propagation network coupled to the second end of said second RF propagation network and the second end of said third RF propagation network coupled to the second port of the input impedance matching network;

a fourth RF propagation network having a first end coupled to the second end of said first RF propagation network and a second end left open circuited; and a fifth RF propagation network having a first end coupled to the second end of said second RF propagation network and a second end connected to ground;

a high electron mobility field effect transistor having source, gate and drain electrodes with said gate electrode coupled to the second port of said input matching network;

means, coupled between the source electrode and a DC reference potential, for providing inductive feedback to the source electrode of said field effect transistor;

an output impedance matching network having a first port coupled to the drain electrode of said field effect transistor and having a second port, said output matching network comprising:

a first RF propagation network having a first end and a second end with the first end coupled to the first port of the output impedance matching network; and a capacitor having a first electrode coupled to the second end of said first RF propagation network and a second electrode coupled to the second port of said output matching network; and a monolithic microwave integrated circuit amplifier having an input port coupled to the second port of said output impedance matching network and having an output port coupled to an output port of the RF amplifier circuit.

2. The RF amplifier of claim 1 further comprising an attenuator having a first port and a second port with the first port of said attenuator coupled to the second port of the output impedance matching network and the second port of the attenuator coupled to the input port of said monolithic microwave integrated circuit amplifier.

3. The RF amplifier of claim 2 wherein said means for providing inductive source feedback comprises an RF propagation network having a high impedance characteristic.

4. The amplifier of claim 3 wherein said attenuator comprises:

a first resistor having a first electrode coupled to the first port of the attenuator and a second electrode;

a second resistor having a first and a second electrode with the first electrode of the second resistor coupled to the second electrode of the first resistor and the second electrode of the second resistor coupled to the second port of the attenuator; and a third resistor having a first electrode coupled to the first electrode of the second resistor and said third resistor having a second electrode coupled to a reference potential.

* * * * *